United States Patent
Yoshida et al.

(10) Patent No.: US 11,476,354 B2
(45) Date of Patent: Oct. 18, 2022

(54) POWER GENERATION ELEMENT

(71) Applicant: KABUSHIKI KAISHA TOSHIBA, Tokyo (JP)

(72) Inventors: Hisashi Yoshida, Kawasaki (JP); Hisao Miyazaki, Yokohama (JP); Shigeya Kimura, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 75 days.

(21) Appl. No.: 17/142,298

(22) Filed: Jan. 6, 2021

(65) Prior Publication Data

US 2021/0384328 A1 Dec. 9, 2021

(30) Foreign Application Priority Data

Jun. 9, 2020 (JP) .............................. JP2020-100161

(51) Int. Cl.
| | | |
|---|---|---|
| *H01L 35/02* | (2006.01) | |
| *H01L 29/73* | (2006.01) | |
| *H01L 27/06* | (2006.01) | |
| *H01L 29/20* | (2006.01) | |

(Continued)

(52) U.S. Cl.
CPC ...... *H01L 29/7317* (2013.01); *H01L 27/0641* (2013.01); *H01L 29/1608* (2013.01); *H01L 29/2003* (2013.01); *H01L 35/18* (2013.01)

(58) Field of Classification Search
CPC ... G21H 1/106; H01J 45/00; H01L 35/00–34; H01L 31/036–03926; H01L 29/1608; H01L 29/2003
See application file for complete search history.

(56) References Cited

U.S. PATENT DOCUMENTS

2011/0081549 A1* 4/2011 Nagata .................. C30B 23/025
428/402
2012/0208355 A1* 8/2012 Hachigo ............... C30B 29/406
257/E21.09

(Continued)

FOREIGN PATENT DOCUMENTS

JP 2017-101164 A 6/2017
JP 6341551 B2 6/2018

(Continued)

OTHER PUBLICATIONS

Large field emission current from Si-doped AlN film grown by MOCVD on n-type (001) 6H-SiC in Chemical Physical Letters 651 (2016) 76-79 by F. Liang et al (Year: 2016).*

(Continued)

*Primary Examiner* — Eric A. Ward
(74) *Attorney, Agent, or Firm* — Oblon, McClelland, Maier & Neustadt, L.L.P.

(57) ABSTRACT

According to one embodiment, a power generation element includes a first conductive layer, a second conductive layer, and a first member. The first member is provided between the first conductive layer and the second conductive layer. The first member includes a first semiconductor having polarity. A gap is between the second conductive layer and the first member. A <000-1> direction of the first semiconductor is oblique to a first direction from the first conductive layer toward the second conductive layer.

18 Claims, 6 Drawing Sheets

(51) Int. Cl.
*H01L 29/16* (2006.01)
*H01L 35/18* (2006.01)

(56) References Cited

U.S. PATENT DOCUMENTS

2014/0124010 A1* 5/2014 Vaudo ..................... H01L 35/34
438/54
2018/0337317 A1 11/2018 Kimura et al.
2020/0028365 A1 1/2020 Yoshida et al.

FOREIGN PATENT DOCUMENTS

JP 2018-195790 A 12/2018
JP 2020-013886 A 1/2020

OTHER PUBLICATIONS

"Photon-enhanced thermionic emission for solar concentrator systems" in Nature Materials, vol. 9, pp. 762-767 (2010), to Jared W. Schwede et al. (Year: 2010).*

* cited by examiner

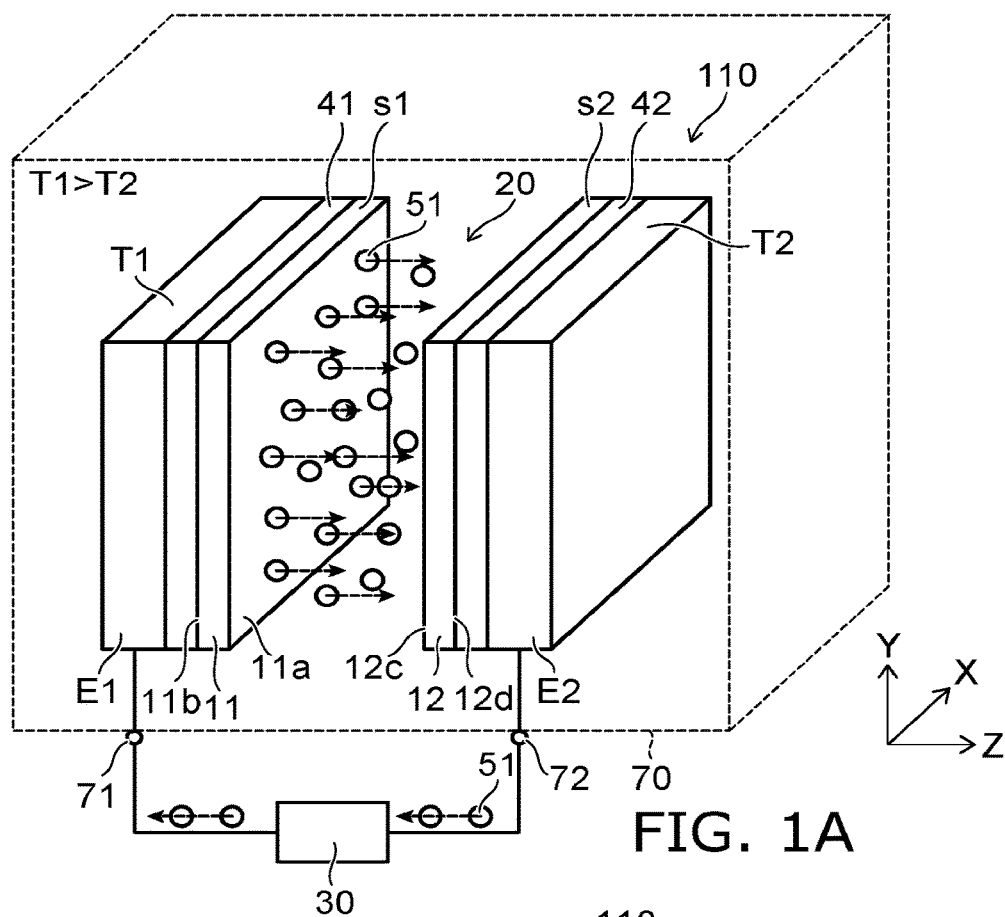
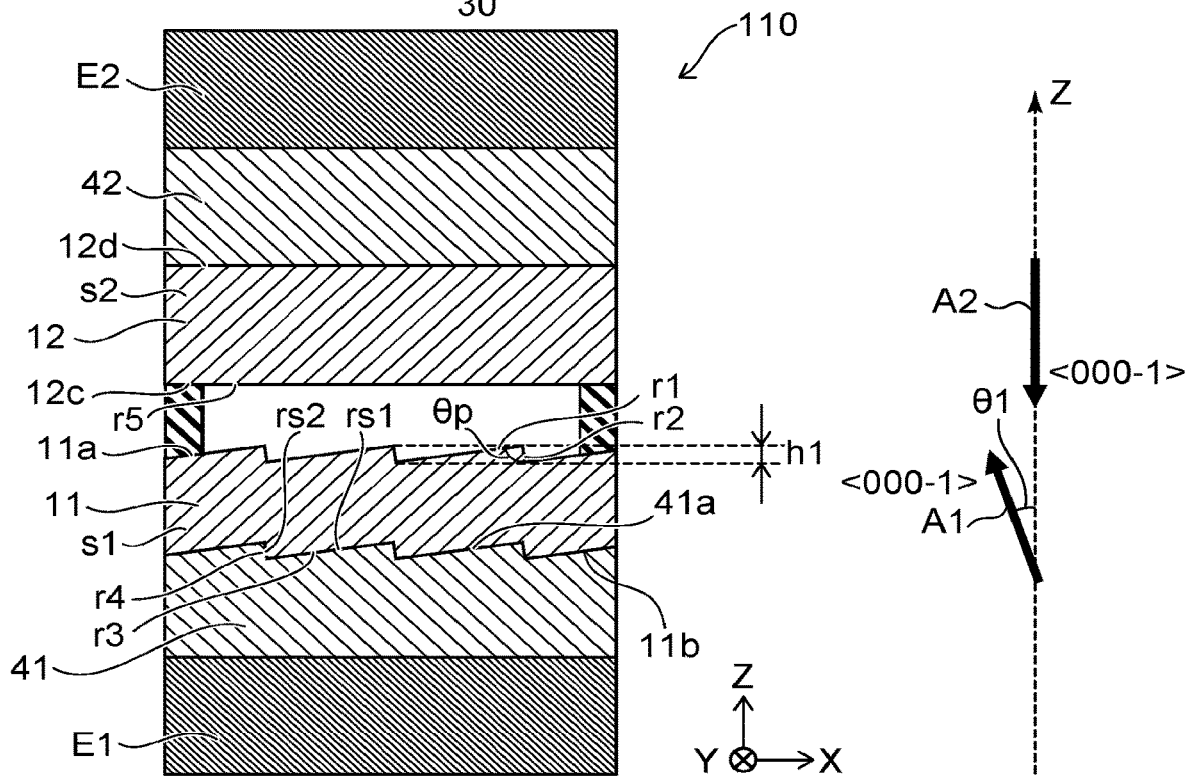
FIG. 1A
FIG. 1B
FIG. 1C

POWER GENERATION ELEMENT

CROSS-REFERENCE TO RELATED APPLICATIONS

This application is based upon and claims the benefit of priority from Japanese Patent Application No. 2020-100161, filed on Jun. 9, 2020; the entire contents of which are incorporated herein by reference.

FIELD

Embodiments described herein generally relate to a power generation element.

BACKGROUND

For example, there is a power generation element including an emitter electrode to which heat is applied from a heat source, and a collector electrode capturing thermions from the emitter electrode. It is desirable to increase the efficiency of the power generation element.

BRIEF DESCRIPTION OF THE DRAWINGS

FIGS. 1A to 1C are schematic views illustrating a power generation element according to a first embodiment;

DETAILED DESCRIPTION

Figure 2:
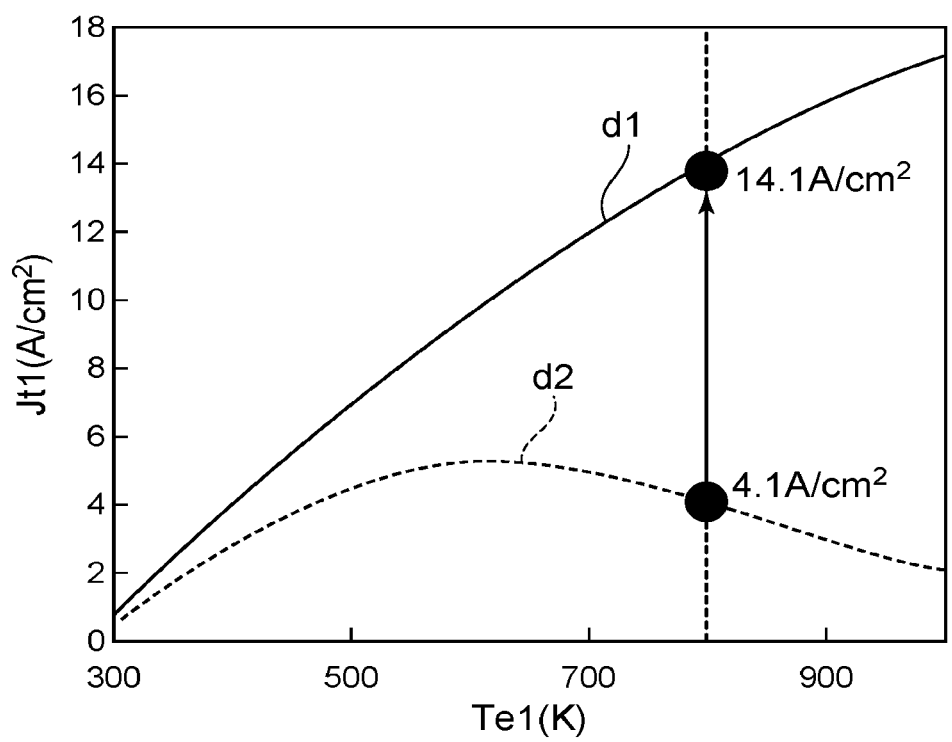
FIG. 2 is a graph illustrating characteristics of the power generation element.

According to one embodiment, a power generation element includes a first conductive layer, a second conductive layer, and a first member. The first member is provided between the first conductive layer and the second conductive layer. The first member includes a first semiconductor having polarity. A gap is between the second conductive layer and the first member. A <000-1> direction of the first semiconductor is oblique to a first direction from the first conductive layer toward the second conductive layer.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIGS. 1A to 1C are schematic views illustrating a power generation element according to a first embodiment.

FIG. 1A is a perspective view. FIG. 1B is a cross-sectional view.

As shown in FIG. 1A, the power generation element 110 (the electron-emitting element) according to the first embodiment includes a first conductive layer E1, a second conductive layer E2, and a first member 11. In the example, the power generation element 110 further includes a second member 12.

The first member 11 is located between the first conductive layer E1 and the second conductive layer E2. The second member 12 is located between the first member 11 and the second conductive layer E2. The second member 12 is separated from the first member 11.

A gap 20 is provided between the second conductive layer E2 and the first member 11. In the example, the gap 20 is located between the first member 11 and the second member 12. In one example, the gap 20 is in a reduced-pressure state. For example, a container 70 is provided. The first member 11 and the second member 12 are located inside the container 70. The interior of the container 70 is set to a reduced-pressure state. Thereby, the gap 20 is in a reduced-pressure state.

The first member 11 includes a first semiconductor s1 that has a polarity. The second member 12 includes a second semiconductor s2 that has a polarity.

The first semiconductor s1 and the second semiconductor s2 are, for example, n-type semiconductors. The n-type impurity is, for example, at least one element selected from the group consisting of Si, Ge, Te, and Sn. The first semiconductor s1 and the second semiconductor s2 are, for example, crystals (polarized crystals) of nitride semiconductors. The first semiconductor s1 may include $Al_{x1}Ga_{1-x1}N$ ($0 \leq x1 \leq 1$). The composition ratio x1 is, for example, not less than 0.75 and not more than 1.0. The second semiconductor s2 may include $Al_{x1}Ga_{1-x1}N$ ($0 \leq x2 \leq 1$). The composition ratio x2 is, for example, not less than 0.75 and not more than 1.0. The first semiconductor s1 and the second semiconductor s2 may include n-type AlN or n-type GaN.

The first member 11 includes a first surface 11a and a second surface 11b. The first surface 11a is at the second conductive layer E2 side (the second member 12 side). The second surface 11b is at the side opposite to the first surface 11a. The second surface 11b is between the first surface 11a and the first conductive layer E1. For example, the first surface 11a faces the second member 12. The first surface 11a is, for example, an electron-emitting surface.

The second member 12 includes a third surface 12c and a fourth surface 12d. The third surface 12c is at the first conductive layer E1 side (the first member 11 side). The fourth surface 12d is at the side opposite to the third surface 12c. The fourth surface 12d is between the third surface 12c and the second conductive layer E2. For example, the third surface 12c faces the first member 11.

The direction from the first conductive layer E1 toward the second conductive layer E2 is taken as a Z-axis direction (a first direction). When viewed macroscopically, the Z-axis direction is a direction perpendicular to the first surface 11a. For example, the Z-axis direction corresponds to the direction of the shortest line connecting the first member 11 and the second conductive layer E2 (or the second member 12). The Z-axis direction corresponds to the stacking direction.

One direction perpendicular to the Z-axis direction is taken as an X-axis direction. A direction perpendicular to the Z-axis direction and the X-axis direction is taken as a Y-axis direction. The first member 11 and the second member 12 have film shapes spreading along the X-Y plane. When viewed macroscopically, the first surface 11a and the third surface 12c are along (e.g., parallel to) the X-Y plane.

The <000-1> direction of the first semiconductor s1 is oblique to the Z-axis direction (the first direction). In the notation of "<000-1>", the "-" corresponds to a "bar". For example, the <000-1> direction is the reverse of the <0001> direction. The <000-1> direction is, for example, the −c direction.

The first member 11 is electrically connected to the first conductive layer E1. The second member 12 is electrically connected to the second conductive layer E2.

For example, a first terminal 71 and a second terminal 72 are provided as shown in FIG. 1A. The first terminal 71 is electrically connected to the first conductive layer E1. The second terminal 72 is electrically connected to the second conductive layer E2. A load 30 is electrically connectable between the first terminal 71 and the second terminal 72.

For example, the temperature of the first conductive layer E1 (and the first member 11) is taken as a first temperature T1. The temperature of the second conductive layer E2 (and the second member 12) is taken as a second temperature T2. For example, the temperature (the first temperature T1) of the first member 11 is set to be greater than the temperature (the second temperature T2) of the second member 12. For example, the first conductive layer E1 (and the first member 11) is connected to a heat source, etc. Thereby, the first temperature T1 becomes greater than the second temperature T2. Thereby, electrons 51 are emitted from the first member 11. The electrons 51 are, for example, thermions. The electrons 51 travel toward the second member 12. The electrons 51 reach the second member 12.

The electrons 51 that reach the second member 12 flow in the load 30 via the second conductive layer E2 and the second terminal 72. The flow of the electrons 51 corresponds to a current.

Thus, in the power generation element 110, the temperature difference between the first conductive layer E1 (and the first member 11) and the second conductive layer E2 (and the second member 12) can be converted into a current.

The first conductive layer E1 (and the first member 11) is, for example, an emitter. The second conductive layer E2 (and the second member 12) is, for example, a collector.

When the <000-1> direction is parallel to the Z-axis direction, the surface (the first surface 11a) of the first member 11 is only the (000-1) plane parallel to the X-Y plane. In such a case, the surface of the first member 11 is flat. Conversely, when the <000-1> direction is oblique to the Z-axis direction, the (000-1) plane and another plane exist in the surface of the first member 11, and a microscopic surface asperity (referring to FIG. 1B) exists as illustrated in FIG. 1B. The surface asperity includes protrusion and depression, for example. Due to the surface asperity, the surface area of the first member 11 when the <000-1> direction is oblique to the Z-axis direction is greater than the surface area of the first member 11 when the <000-1> direction is parallel to the Z-axis direction. By setting the <000-1> direction to be oblique to the Z-axis direction, the surface area of the electron-emitting surface can be increased. The electron emission characteristics can be improved, and the efficiency of the power generation element can be increased.

In the crystal of the first semiconductor s1, the <000-1> direction is a direction in which the emission efficiency of the electrons is high. For example, the emission efficiency of the electrons from the (000-1) plane perpendicular to the <000-1> direction is greater than the emission efficiency of the electrons from the other crystal plane. By setting the <000-1> direction to be oblique to the Z-axis direction, the proportion in the surface of the first member 11 of the (000-1) plane, which has the high emission efficiency of the electrons, decreases, and the proportion in the surface of the first member 11 of the other crystal plane increases. Therefore, an appropriate range of the angle of the obliqueness exists from the perspective of the surface area of (000-1), which has the high efficiency of the emission of the electrons, and the surface area based on the surface asperity of the first member 11. An example of an appropriate range is described below.

As shown in FIG. 1C, an angle θ1 between the Z-axis direction and the <000-1> direction (arrow A1) of the first semiconductor s1 is, for example, not less than 4° and not more than 32°. The angle θ1 may be, for example, greater than 4°. The angle θ1 may be, for example, greater than 8°.

The configuration of the first member 11 (the first surface 11a and the second surface 11b) is enlarged in FIG. 1B for better understanding. As shown in FIG. 1B, the first surface 11a includes a first region r1. The first region r1 is along the (000-1) plane of the first semiconductor s1.

The first region r1 is, for example, the (000-1) plane. The first region r1 is, for example, a Group IV surface (e.g., an N-surface). The first region r1 is, for example, Group IV-polar (e.g., N-polar).

The first region r1 is oblique to the X-Y plane. In other words, the <000-1> direction of the first semiconductor s1 is oblique to the Z-axis direction.

In the example, the first surface 11a further includes a second region r2. The second region r2 is arranged with the first region r1 in the X-Y plane. For example, the direction from the first region r1 toward the second region r2 is along a second direction (e.g., the X-axis direction or the Y-axis direction) crossing the first direction (the Z-axis direction).

The second region r2 crosses the first region r1. For example, the second region r2 may be the a-plane or the m-plane of the first semiconductor s1. For example, the first region r1 may be a polar surface (N-polar surface), and the second region r2 may be a non-polar surface. Thus, in the example, the second region r2 is provided in addition to the first region r1. Thereby, the surface area of the entire first surface 11a can be increased, and the efficiency of the power generation element can be increased.

A step is provided between the first region r1 and the second region r2 that are next to each other. A height h1 (the length along the Z-axis direction) of the step is, for example, not less than 0.2 nm and not more than 250 nm. Multiple first regions r1 and multiple second regions r2 are provided in the example. For example, the first region r1 and the second region r2 are alternately arranged in the X-axis direction. Thereby, multiple steps (a microscopic surface asperity) are provided in the first surface 11a.

The surface area of the first region r1 is greater than the surface area of the second region r2. For example, the surface area of the first region r1 is not less than 1.7 times and not more than 402 times the surface area of the second region r2. For example, an angle θp between the first region r1 and the second region r2 is 90°.

As shown in FIG. 1B, a microscopic surface asperity is provided also in the second surface 11b. For example, the second surface 11b includes a third region r3 and a fourth region r4. The direction from the third region r3 toward the fourth region r4 is along the second direction (the X-axis direction or the Y-axis direction). The fourth region r4 crosses the third region r3. For example, the third region r3 is parallel to the first region r1. For example, the fourth region r4 is parallel to the second region r2.

In the example, the <000-1> direction of the second semiconductor s2 of the second member 12 is along (e.g., parallel to) the Z-axis direction. As shown in FIG. 1C, for example, the angle between the Z-axis direction and the <000-1> direction (arrow A2) of the second semiconductor s2 is not less than 0° but less than 4°.

In the example, a microscopic surface asperity such as that of the first member 11 is not provided in the third or fourth surface 12c or 12d of the second member 12. For example, the third surface 12c is flatter than the first surface 11a. The third surface 12c (the fifth region r5) is along the (000-1) plane of the second semiconductor s2. The third surface 12c (the fifth region r5) is, for example, the (000-1) plane. The fifth region r5 is, for example, a Group IV surface (e.g., an N-surface). The fifth region r5 is, for example, Group IV-polar (e.g., N-polar).

In the example as shown in FIG. 1B, the power generation element 110 includes a first substrate 41 and a second substrate 42.

The first substrate 41 is located between the first conductive layer E1 and the first member 11. The first substrate 41 contacts the first conductive layer E1 and the first member 11.

The second substrate 42 is located between the second conductive layer E2 and the second member 12. The second substrate 42 contacts the second conductive layer E2 and the second member 12.

The first substrate 41 and the second substrate 42 are, for example, n-type SiC substrates. The first substrate 41 and the second substrate 42 may be silicon substrates.

A surface asperity that corresponds to the second surface 11b is in the surface (a first substrate surface 41a) of the first substrate 41 contacting the first member 11. The first substrate surface 41a includes a first substrate region rs1 that contacts the third region r3, and a second substrate region rs2 that contacts the fourth region r4. A step is provided between the first substrate region rs1 and the second substrate region rs2.

The first substrate 41 may be, for example, an "offset substrate". A nitride semiconductor is grown on the offset substrate by metal-organic chemical vapor deposition (MOCVD), etc. The first member 11 may be formed thereby. Thereby, the manufacturing is easy.

FIG. 2 is a graph illustrating characteristics of the power generation element.

The horizontal axis of FIG. 2 is an emitter temperature Te1 of the power generation element. The vertical axis of FIG. 2 is a current density Jt1 due to the electrons emitted from the emitter. In FIG. 2, a characteristic d1 shows the current density of the polar surface (the (000-1) plane), and a characteristic d2 shows the current density of the non-polar surface. The polar surface corresponds to, for example, the first region r1, and the non-polar surface corresponds to, for example, the second region r2.

For example, the current density of the non-polar surface when the emitter temperature Te1 is 800 K is 4.1 A/cm$^2$. On the other hand, the current density of the polar surface when the emitter temperature Te1 is 800 K is 14.1 A/cm$^2$. Thus, the current density of the polar surface is greater than the current density of the non-polar surface. The emission efficiency of the electrons of the first region r1 is greater than the emission efficiency of the electrons of the second region r2.

Surfaces such as the first and second regions r1 and r2 that have different emission efficiencies may be provided in the embodiment. The efficiency of the power generation element can be increased thereby. This is described below.

Figure 3A:
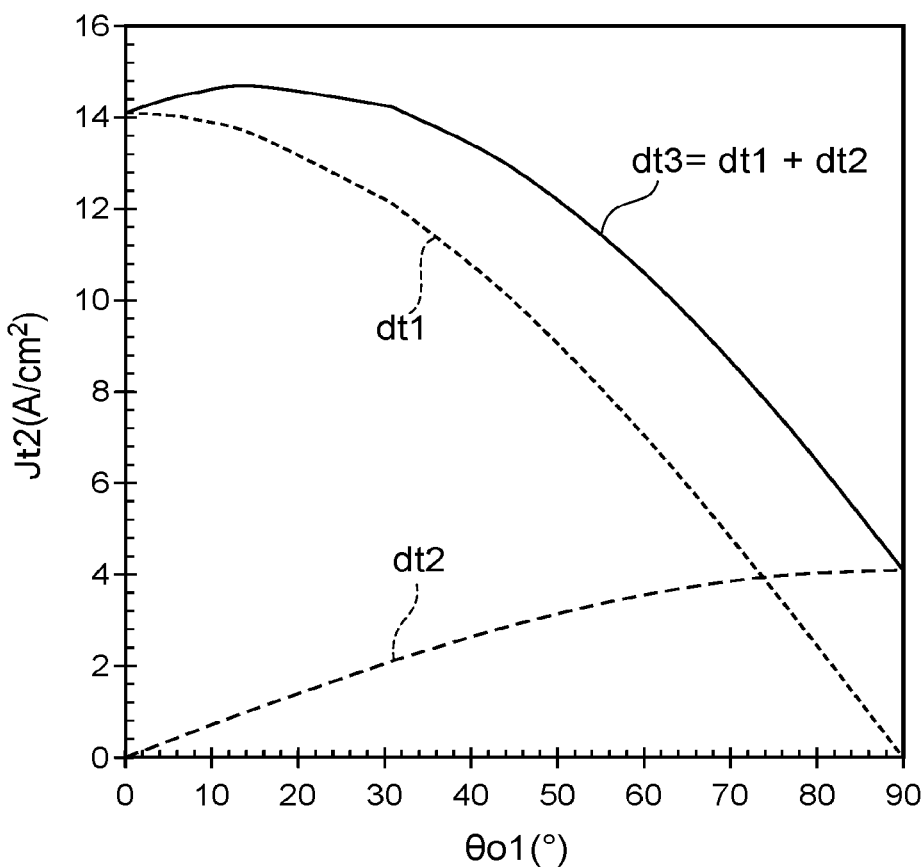
FIGS. 3A and 3B are schematic views illustrating characteristics of the power generation element.
Figure 3B:
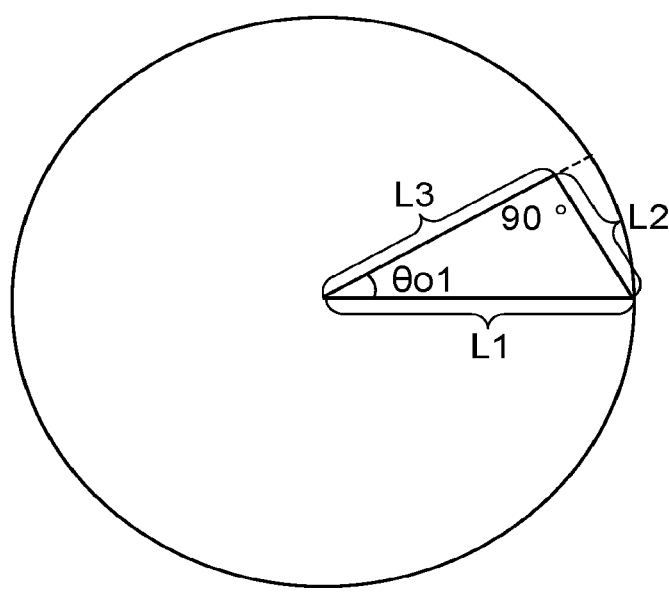

FIGS. 3A and 3B are schematic views illustrating characteristics of the power generation element.

The horizontal axis of FIG. 3A is an angle $\theta o1°$. The angle $\theta o1$ corresponds to an angle $\theta 1$ between the Z-axis direction and the <000-1> direction of the first semiconductor s1 (referring to FIG. 1C). The vertical axis is a current density Jt2 of the thermions emitted at 800 K.

In FIG. 3A, a characteristic dt1 shows the current density of the polar surface (the (000-1) plane). The characteristic dt1 corresponds to the current density of the first region r1. A characteristic dt2 shows the current density of the non-polar surface. The characteristic dt2 corresponds to the current density of the second region r2. A characteristic dt3 is the sum of the characteristic dt1 and the characteristic dt2.

As shown in FIG. 3A, the characteristic dt1 decreases as the angle $\theta o1$ increases. On the other hand, the characteristic dt2 increases as the angle $\theta o1$ increases. As shown in FIG. 3A, the characteristic dt3 has a peak in the range in which the angle $\theta o1$ is not less than 0 degrees and not more than 32 degrees.

FIG. 3B schematically illustrates the relationship between the angle $\theta o1$ and the surface area of the electron-emitting surface. In this model, the angle between the polar surface and the non-polar surface is 90°. When the angle $\theta o1$ is zero, the surface area of the polar surface corresponds to a length L1. At this time, the surface area of the electron-emitting surface of the power generation element corresponds to the length L1. On the other hand, when the polar surface is oblique (when $\theta o1>0$), the surface area of the polar surface corresponds to a length L3. When the polar surface is oblique and the non-polar surface is provided, the surface area of the non-polar surface corresponds to a length L2. In such a case, the surface area of the electron-emitting surface of the power generation element corresponds to the sum of the length L2 and the length L3.

For example, it can be seen from the comparison between the length L1 and the length L3 that the surface area of the polar surface decreases as the angle $\theta o1$ increases. Therefore, in FIG. 3A, the characteristic dt1 decreases as the angle $\theta o1$ increases. On the other hand, as the angle $\theta o1$ increases, the length L2 increases, and the surface area of the non-polar surface increases. Therefore, in FIG. 3A, the characteristic dt2 increases as the angle $\theta o1$ increases.

As shown by the characteristic dt3 of FIG. 3A, the total current density in the range in which the angle $\theta o1$ is greater than 0° and not more than 32° is large compared to when the angle $\theta o1$ is zero. The total current density is increased by increasing the total surface area of the polar surface and the non-polar surface. For example, the current density has a maximum in the range in which the angle $\theta o1$ is not less than 10° and not more than 20°. For example, by setting the angle $\theta 1$ (referring to FIG. 1C) to be, for example, not less than 4° and not more than 32°, the efficiency of the power generation element can be increased. The angle $\theta 1$ may be not less than 10° and not more than 20°.

In the embodiment, at least one of an alkaline metal or an alkaline earth metal may be sealed in the gap 20, which is in a reduced-pressure state (referring to FIG. 1A). The alkaline metal and the alkaline earth metal are adhered to the surface of the first member 11 and increase the electron emission efficiency. The alkaline metal and the alkaline earth metal are, for example, Cs.

Second Embodiment

Figures 4A, 4B:
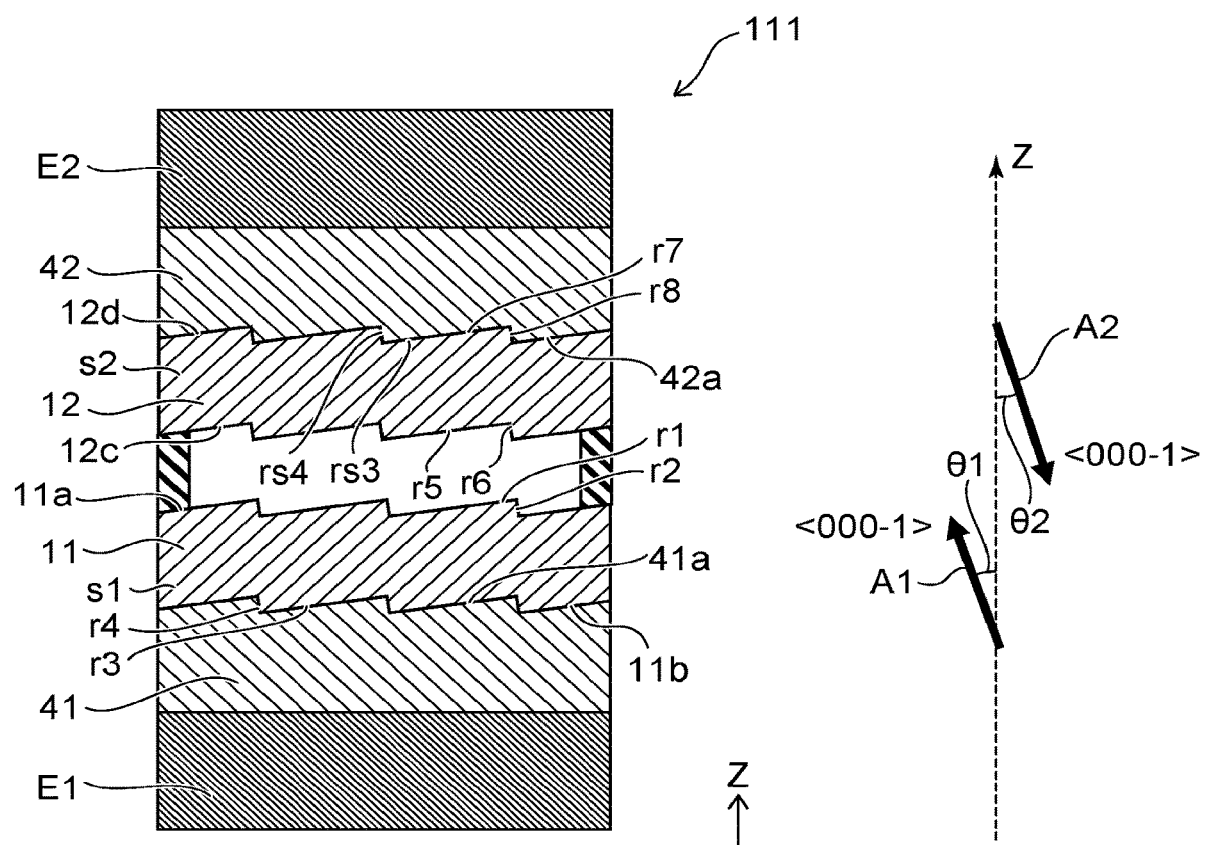
FIGS. 4A and 4B are schematic views illustrating a power generation element according to a second embodiment.

FIGS. 4A and 4B are schematic views illustrating a power generation element according to a second embodiment. FIG.

4A is a schematic cross-sectional view. The structures of the second substrate 42 and the second member 12 of the emitter of the power generation element 111 according to the second embodiment are different from the respective structures of the power generation element 110 according to the first embodiment. Otherwise, a configuration similar to the first embodiment is applicable to the power generation element 111.

In the second embodiment, the <000-1> direction of the second semiconductor s2 is oblique to the Z-axis direction (the first direction). For example, the reception of the electrons into the second semiconductor s2 is more effectively performed thereby. For example, as shown in FIG. 4B, an angle θ2 between the Z-axis direction and the <000-1> direction (arrow A2) of the second semiconductor s2 is, for example, not less than 4° and not more than 32°. The angle θ2 may be equal to the angle θ1.

As shown in FIG. 4A, the third surface 12c includes the fifth region r5. The fifth region r5 is along the (000-1) plane of the second semiconductor s2. The fifth region r5 is, for example, the (000-1) plane. The fifth region r5 is oblique to the X-Y plane. In other words, the <000-1> direction of the second semiconductor s2 is oblique to the Z-axis direction (the first direction).

In the example, the third surface 12c further includes a sixth region r6. The sixth region r6 is arranged with the fifth region r5 in the X-Y plane. The direction from the fifth region r5 toward the sixth region r6 is along the second direction (the X-axis direction or the Y-axis direction) crossing the first direction (the Z-axis direction). The sixth region r6 crosses the fifth region r5. For example, the sixth region r6 may be the a-plane or the m-plane of the second semiconductor s2. For example, the fifth region r5 may be a polar surface, and the sixth region r6 may be a non-polar surface.

A step is provided between the fifth region r5 and the sixth region r6 that are next to each other. For example, multiple fifth regions r5 and multiple sixth regions r6 are alternately arranged in the X-axis direction, and multiple steps (a microscopic surface asperity) are provided in the third surface 12c. The fifth region r5 faces the first region r1 of the first member 11. The fifth region r5 and the first region r1 are, for example, parallel.

The structure of the second member 12 and the second substrate 42 may be the structure of the first member 11 and the first substrate 41 inverted 180°. For example, the fourth surface 12d includes a seventh region r7 and an eighth region r8. The seventh region r7 and the eighth region r8 are respectively similar to the third and fourth regions r3 and r4. For example, the surface (a second substrate surface 42a) of the second substrate 42 contacting the second member 12 includes a third substrate region rs3 and a fourth substrate region rs4. The third substrate region rs3 and the fourth substrate region rs4 are respectively similar to the first substrate region rs1 and the second substrate region rs2 (referring to FIG. 1B).

Third Embodiment

Figure 5A:
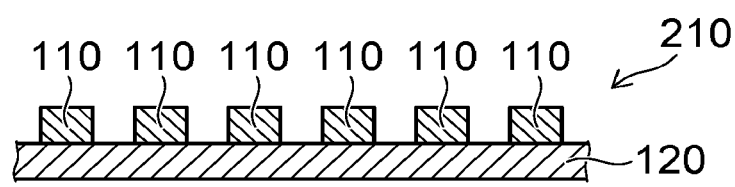
FIGS. 5A and 5B are schematic cross-sectional views showing a power generation module and a power generation device according to a third embodiment.
Figure 5B:
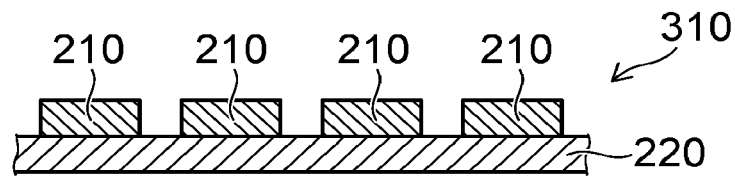

FIGS. 5A and 5B are schematic cross-sectional views showing a power generation module and a power generation device according to a third embodiment.

As shown in FIG. 5A, the power generation module 210 according to the embodiment includes the power generation element (e.g., the power generation element 110, etc.) according to the first embodiment. In the example, multiple power generation elements 110 are arranged on the substrate 120.

As shown in FIG. 5B, the power generation device 310 according to the embodiment includes the power generation module 210 described above. Multiple power generation modules 210 may be provided. In the example, the multiple power generation modules 210 are arranged on the substrate 220.

Figure 6A:
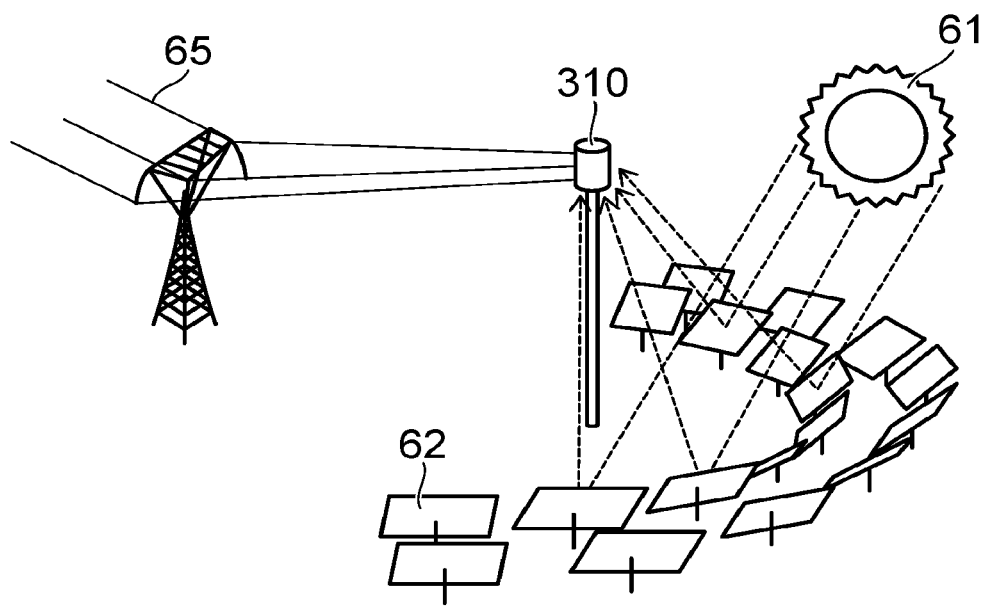
FIGS. 6A and 6B are schematic views showing the power generation device and the power generation system according to the embodiment.
Figure 6B:
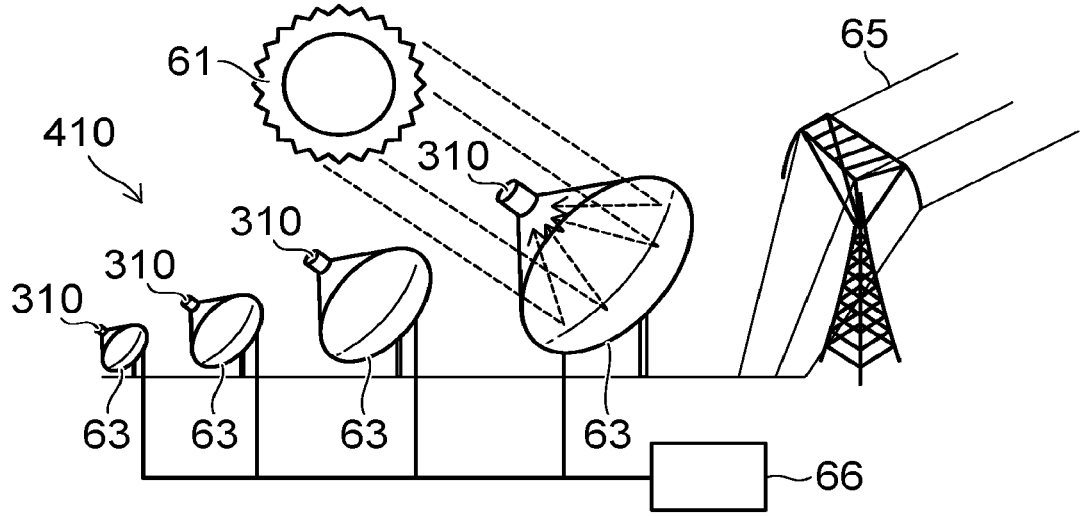

FIGS. 6A and 6B are schematic views showing the power generation device and the power generation system according to the embodiment.

As shown in FIGS. 6A and 6B, the power generation device 310 according to the embodiment (i.e., the power generation element 110, etc., according to the embodiment) is applicable to solar thermal power generation.

As shown in FIG. 6A, for example, the light from the sun 61 is reflected by a heliostat 62 and is incident on the power generation device 310 (the power generation element 110 or the power generation module 210). The light causes the first temperature T1 of the first conductive layer E1 and the first member 11 to increase. The first temperature T1 becomes greater than the second temperature T2. The heat is converted into a current. The current is transmitted by a power line 65, etc.

As shown in FIG. 6B, for example, the light from the sun 61 is concentrated by a concentrating mirror 63 and is incident on the power generation device 310 (the power generation element 110 or the power generation module 210). The heat due to the light is converted into a current. The current is transmitted by the power line 65, etc.

For example, the power generation system 410 includes the power generation device 310. In the example, multiple power generation devices 310 are provided. In the example, the power generation system 410 includes the power generation device 310 and the drive device 66. The drive device 66 causes the power generation device 310 to follow the movement of the sun 61. Efficient power generation can be performed by following the sun 61.

According to the embodiments, highly efficient power generation can be performed by using the power generation element (e.g., the power generation element 110, etc.).

According to the embodiments, a power generation element can be provided in which the efficiency can be increased.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in power generation elements such as first conductive layers, second conductive layers, first members, second members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all power generation elements practicable by an appropriate design modification by one skilled in the art based on the power generation elements described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A power generation element, comprising:
a first conductive layer;
a second conductive layer; and
a first member provided between the first conductive layer and the second conductive layer, the first member including a first semiconductor having polarity,
a gap being between the second conductive layer and the first member,
a <000-1> direction of the first semiconductor being oblique to a first direction from the first conductive layer ow the second conductive layer,
wherein
the first member includes:
a first surface; and
a second surface between the first surface and the first conductive layer, and
the first surface includes a first region along a (000-1) plane of the first semiconductor.

2. The element according to claim 1, wherein the first semiconductor includes Alx1Ga1-x1N (0≤x1≤1).

3. The element according to claim 1, wherein the first semiconductor is of an n-type.

4. The element according to claim 1, wherein an angle between the first direction and the <000-1> direction of the first semiconductor is not less than 4° and not more than 32°.

5. The element according to claim 1, wherein the first surface further includes a second region,
a direction from the first region toward the second region is along a second direction crossing the first direction, and
the second region crosses the first region.

6. The element according to claim 5, wherein an angle between the first region and the second region is 90°.

7. The element according to claim 5, wherein an electron emission efficiency of the first region is greater than an electron emission efficiency of the second region.

8. The element according to claim 1, wherein
the second surface includes a third region and a fourth region,
a direction from the third region toward the fourth region is along a second direction crossing the first direction, and
the fourth region crosses the third region.

9. The element according to claim 1, further comprising:
a first substrate provided between the first conductive layer and the first member.

10. The element according to claim 9, wherein the first substrate includes n-type SiC.

11. The element according to claim 1, further comprising:
a second member provided between the first member and the second conductive layer and separated from the first member, the second member including a second semiconductor having a polarity.

12. The element according to claim 11, wherein the second semiconductor includes Alx1Ga1-x1N (0≤x2≤1).

13. A power generation element, comprising:
a first conductive layer;
a second conductive layer;
a first member provided between the first conductive layer and the second conductive laver, the first member including a first semiconductor having polarity; and
a second member,
a gap being between the second conductive layer and the first member,
a <000-1> direction of the first semiconductor being oblique to a first direction from the first conductive layer toward the second conductive layer,
the second member being provided between the first member and the second conductive layer and separated from the first member, the second member including a second semiconductor having a polarity,
wherein
the second member includes:
a third surface; and
a fourth surface between the third surface and the second conductive layer, and
the third surface includes a fifth region along a (000-1) plane of the second semiconductor.

14. The element according to claim 13, wherein a <000-1> direction of the second semiconductor is along the first direction.

15. The element according to claim 13, wherein an angle between the first direction and a <000-1> direction of the second semiconductor is not less than 0° but less than 4°.

16. The element according to claim 13, wherein an angle between the first direction and a <000-1> direction of the second semiconductor is not less than 4° and not more than 32°.

17. The element according to claim 13, wherein
the third surface further includes a sixth region,
a direction from the fifth region toward the sixth region is along a second direction crossing the first direction, and
the sixth region crosses the fifth region.

18. A power generation element, comprising:
a first conductive layer;
a second conductive layer;
a first member provided between the first conductive layer and the second conductive laver, the first member including a first semiconductor having polarity; and
a second member,
a gap being between the second conductive layer and the first member, a <000-1> direction of the first semiconductor being oblique to a first direction from the first conductive layer toward the second conductive layer, the second member being provided between the first member and the second conductive layer and separated from the first member, the second member including a second semiconductor having a polarity, wherein a <000-1> direction of the second semiconductor is oblique to the first direction.

* * * * *